(12) United States Patent
Miller et al.

(10) Patent No.: US 7,847,297 B2
(45) Date of Patent: Dec. 7, 2010

(54) OHMIC CONTACT ON P-TYPE GAN

(75) Inventors: Jeffrey N Miller, Los Altos Hills, CA (US); David P Bour, Cupertino, CA (US); Virginia M Robbins, Los Gatos, CA (US); Steven D Lester, Palo Alto, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 86 days.

(21) Appl. No.: 12/356,310

(22) Filed: Jan. 20, 2009

(65) Prior Publication Data

US 2009/0179229 A1    Jul. 16, 2009

Related U.S. Application Data

(62) Division of application No. 11/234,993, filed on Sep. 26, 2005, now Pat. No. 7,495,314.

(51) Int. Cl.
*H01L 29/15* (2006.01)

(52) U.S. Cl. ............ 257/78; 257/76; 257/201; 257/200; 257/614; 257/E29.096; 257/E29.094; 438/597; 438/603; 438/604

(58) Field of Classification Search ............ None
See application file for complete search history.

(56) References Cited

U.S. PATENT DOCUMENTS

| | | | |
|---|---|---|---|
| 5,585,649 A | 12/1996 | Ishikawa et al. | |
| 5,604,356 A | 2/1997 | Shiraishi | |
| 5,786,603 A * | 7/1998 | Rennie et al. | 257/13 |
| 6,046,464 A * | 4/2000 | Schetzina | 257/96 |
| 6,069,367 A | 5/2000 | Tomiya | |
| 2005/0173728 A1 | 8/2005 | Saxler | |

* cited by examiner

*Primary Examiner*—Victor A Mandala
*Assistant Examiner*—Fei Fei Yeung Lopez

(57) ABSTRACT

An ohmic contact in accordance with the invention includes a layer of p-type GaN-based material. A first layer of a group II-VI compound semiconductor is located adjacent to the layer of p-type GaN-based material. The ohmic contact further includes a metal layer that provides metal contact. A second layer of a different II-VI compound semiconductor is located adjacent to the metal layer.

6 Claims, 7 Drawing Sheets

OHMIC CONTACT ON P-TYPE GAN

CROSS REFERENCE TO RELATED APPLICATION

This application is a divisional application, which is based on, and claims priority to, U.S. Utility patent application Ser. No. 11/234,993 filed Sep. 26, 2005, and which is incorporated herein by reference in its entirety.

DESCRIPTION OF THE RELATED ART

Providing an effective ohmic contact on a semiconductor surface, especially on a p-type semiconductor surface, has traditionally proven to be a challenge. This is in large part due to the presence of a significant valence band offset between the metal of the ohmic contact and the semiconductor material.

For example, an ohmic contact on a p-type semiconductor such as p-ZnSe has been traditionally implemented by evaporating gold on the semiconductor and soldering a bonding wire to the gold using indium metal. Unfortunately, the gold contact often forms a Schottky barrier with the p-type material thereby leading to a higher operating voltage, which in turn leads to generation of heat at the junction. Heat generation is undesirable because it can lead to device failure.

Several different solutions have been proposed to address the shortcomings related to providing an effective ohmic contact on semiconductor materials. For example, U.S. Pat. No. 5,548,137 "Group II-VI Compound Semiconductor Light Emitting Devices and an Ohmic Contact therefor," Fan et al, describes a low resistance ohmic contact on a Group II-VI compound semiconductor such as p-Zn(S, Se) or p-ZnSe. Per Fan et al, "the graded contact eliminates the valence band offset (≈1 eV) between a heterojunction of ZnTe and ZnSe which forms a barrier to hole injection."

While Fan et al addresses the issue of providing an ohmic contact upon a Group II-VI compound semiconductor, it is further desirable to provide effective ohmic contacts on several other semiconductor materials, including certain materials that have been incorporated in recent years into the manufacture of semiconductor devices such as light emitting diodes.

SUMMARY

An ohmic contact in accordance with the invention includes a layer of p-type GaN-based material. A first layer of a group II-VI compound semiconductor is located adjacent to the layer of p-type GaN-based material. The ohmic contact further includes a metal layer that provides metal contact. A second layer of a different II-VI compound semiconductor is located adjacent to the metal layer.

Clearly, some alternative embodiments may exhibit advantages and features in addition to, or in lieu of, those mentioned above. It is intended that all such alternative embodiments be included within the scope of the present invention, and be protected by the accompanying claims.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts throughout the several views.

DETAILED DESCRIPTION

The various embodiments in accordance with the invention generally describe an ohmic contact formed on a p-type GaN-based material. Attention is now drawn to the figures that show various exemplary embodiments. It will be understood that when used below, positional terms such as "top" and "bottom," are used merely for ease of description and are not intended to limit the scope of coverage of the invention.

Figure 1:
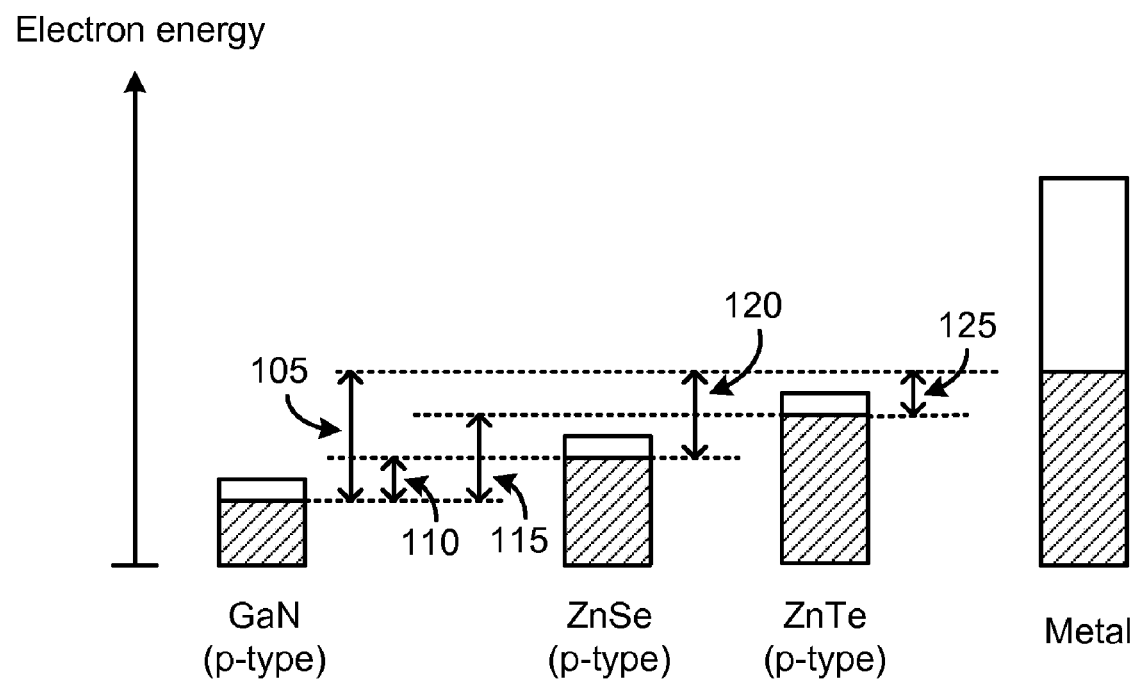
FIG. 1 shows a valence band relationship between metal and certain p-type semiconductor compounds.

FIG. 1 shows a valence band relationship between metal and certain p-type semiconductor compounds. A metal such as gold has a large valence band offset 105 with respect to a p-type GaN-based semiconductor. The GaN-based semiconductor is represented by a general formula $In_xAl_yGa_{1-x-y}N$, where ($0 \leq x \leq 1$) and ($0 \leq y \leq 1$). When x=0, the GaN-based semiconductor is $Al_yGa_{1-y}N$ and when y=0, the GaN-based material is $In_xGa_{1-x}N$. The large valence band offset 105 leads to various shortcomings when a metal contact is formed directly on the GaN-based semiconductor.

Certain Group II-VI semiconductors have a smaller valence band offset with metal than the large valence band offset 105. For example, p-type ZnTe has a valence band offset 125 with metal that is significantly smaller than the large valence band offset 105. Unfortunately, the valence band offset 115 of p-type ZnTe with respect to p-type GaN-based semiconductor is still significant. On the other hand, certain other Group II-VI semiconductors have a smaller valence band offset with the p-type GaN-based semiconductor than valence band offset 115. For example, p-type ZnSe has a valence band offset 110 with p-type GaN-based semiconductor that is smaller than the valence band offset 115 of p-type ZnSe.

The valence band offset relationships between metal, p-type ZnSe, p-type ZnTe, and p-type GaN-based semiconductor has been used to create an ohmic contact in accordance with the invention. Various exemplary embodiments of such ohmic contacts are described below.

Figure 2:
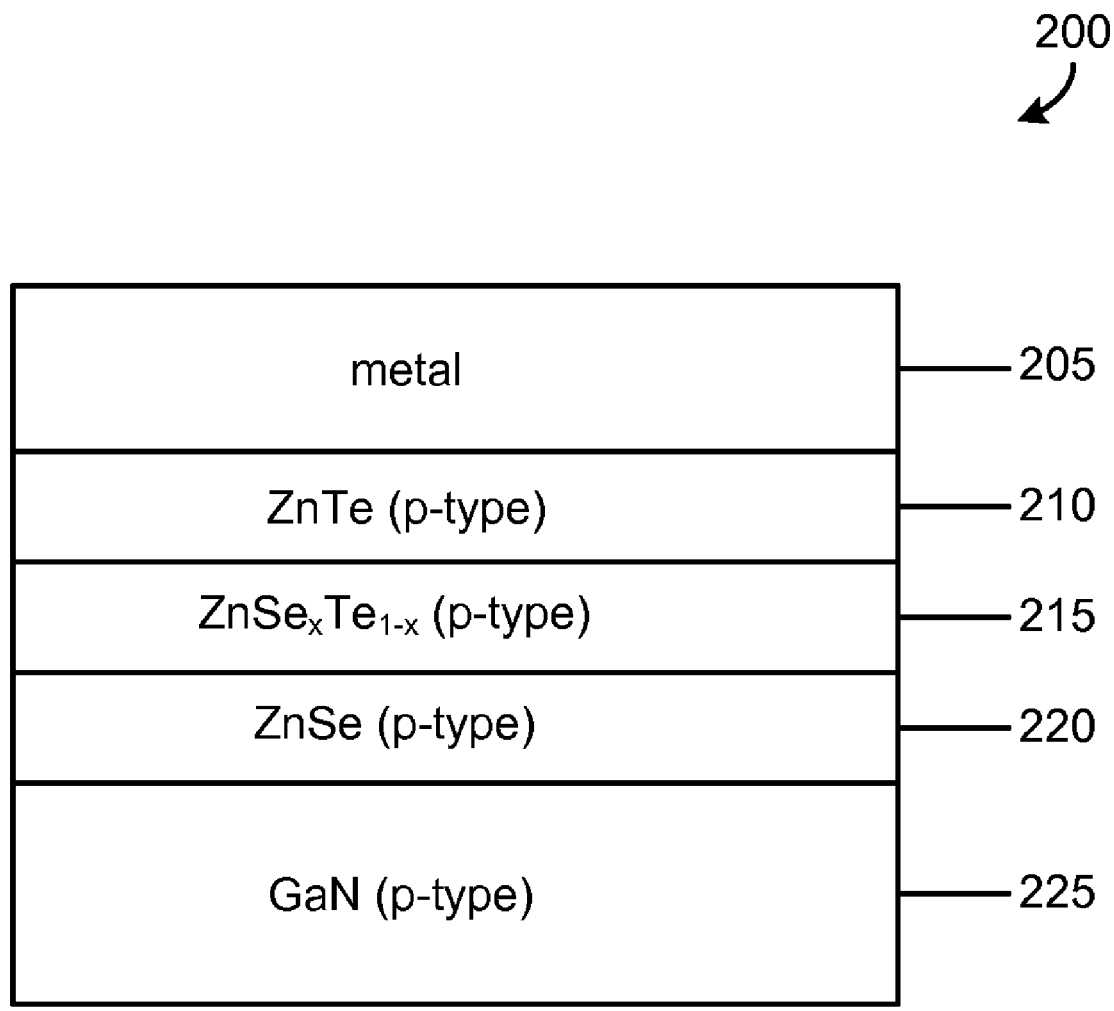
FIG. 2 shows a first exemplary embodiment of an ohmic contact in accordance with the invention.

FIG. 2 shows a first exemplary embodiment of an ohmic contact 200 in accordance with the invention. Ohmic contact 200 provides optimal conductivity between a metal contact, in the form of metal layer 205, and a p-type GaN-based layer 225. Several layers of semiconductor material are sandwiched between p-type GaN-based layer 225 and metal layer 205. The semiconductor materials used in these layers generally belong to the Group II-VI family of compound semiconductors. The compound semiconductor of a first layer is characterized by a general formula XY where X is an element selected from Group II and Y is an element selected from Group VI. The compound semiconductor of a second layer is characterized by a general formula XZ where X is an element selected from Group II and Z is an element selected from Group VI that is different than element Y.

In this exemplary embodiment the first compound semiconductor of the first layer includes Zn of Group II and Se of Group VI, while the compound semiconductor of the second layer includes Zn of Group II together with Se, which is a different element selected from Group VI.

Layer 220 of p-type ZnSe is formed on a major surface of GaN-based layer 225. Layer 220 has a small valence band offset with respect to GaN-based layer 225 thereby providing good electrical conductivity between GaN-based layer 225 and layer 220.

Layer 210 of p-type ZnTe is formed on a bottom major surface of metal layer 205. Layer 210 has a small valence band offset with respect to metal thereby providing good electrical conductivity between metal layer 205 and layer 210.

Sandwiched between layer 220 and layer 210 is a graded bandgap region 215 that can be generally described using a formula $XY_nZ_{1-n}$ ($0<n<1$) where X is an element from Group II, and Y and Z are two different elements selected from Group VI. In this exemplary embodiment, p-type $ZnSe_xTe_{1-x}$ ($0<x<1$) is used. Graded bandgap region 215 provides a graded transition for bridging the valence gap offset between layer 220 and layer 210. At a location close to layer 220 the p-type $ZnSe_xTe_{1-x}$ ($0<x<1$) has a value of x that is nearly equal to 1, while at a location close to layer 210 the p-type $ZnSe_xTe_{1-x}$ ($0<x<1$) has a value of x that is nearly equal to 0.

In one embodiment, x varies linearly from 1 to 0 between the two major surfaces of graded bandgap region 215, with x=0.5 in a mid-region between the two major surfaces. On the other hand, in a second embodiment, x varies non-linearly from 1 to 0 between the two major surfaces of graded bandgap region 215. For example, x=0.3 in a mid-region between the two major surfaces.

Figure 3:
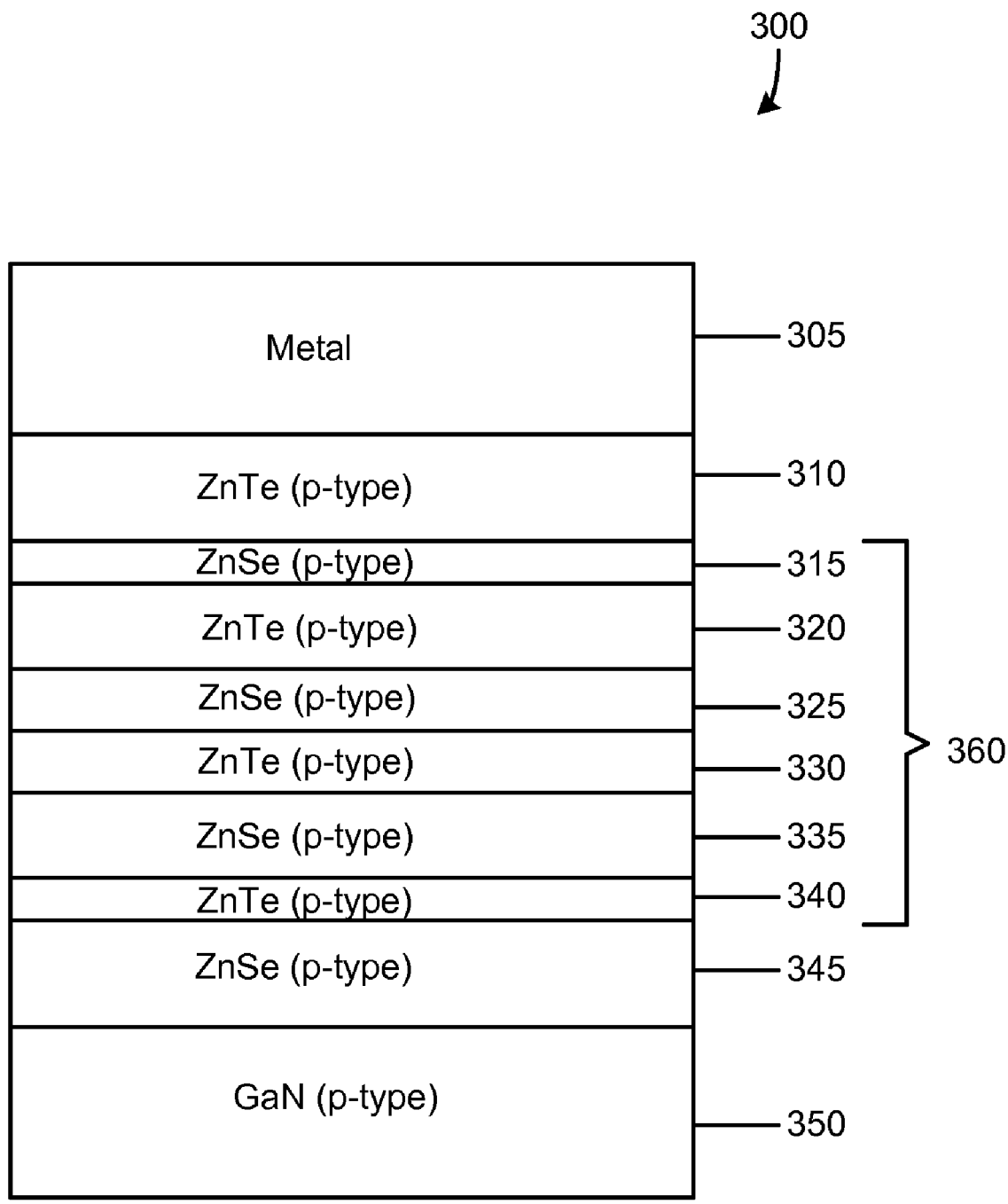
FIG. 3 shows a second exemplary embodiment of an ohmic contact in accordance with the invention.

FIG. 3 shows a second exemplary embodiment of an ohmic contact 300 in accordance with the invention. Ohmic contact 300 provides optimal conductivity between a metal contact, in the form of metal layer 305, and a p-type GaN-based layer 350. Several layers of semiconductor material are sandwiched between p-type GaN-based layer 350 and metal layer 305. The semiconductor materials used in these layers generally belong to the Group II-VI family of compound semiconductors. The compound semiconductor of a first layer is characterized by a general formula XY where X is an element selected from Group II and Y is an element selected from Group VI. The compound semiconductor of a second layer is characterized by a general formula XZ where X is an element selected from Group II and Z is an element selected from Group VI that is different than element Y.

Similar to the embodiment shown in FIG. 2, a layer 345 of p-type ZnSe is formed on a major surface of GaN-based layer 350, and a layer 310 of p-type ZnTe is formed on a bottom major surface of metal layer 305. Whereas the embodiment of FIG. 2 shows a continuously graded bandgap region 215, the exemplary embodiment shown in FIG. 3 incorporates a p-type semiconductor stack 360 having a number of discrete layers. A first set of discrete layers of p-type semiconductor stack 360 are formed of p-type ZnTe, while a second set of discrete layers of p-type semiconductor stack 360 are formed of p-type ZnSe. The first set of discrete layers, which includes ZnTe layers 340, 330, and 320, is interspersed with the second set of discrete layers, which includes ZnSe layers 335, 325, and 315. For example, ZnTe layer 320 is located between ZnSe layers 325 and 315, while ZnSe layer 335 is located between ZnTe layers 340 and 330.

On the other hand, the thickness of each individual layer in the first set of discrete layers increases as the individual layer is located further away from GaN-based layer 350. For example, the thickness of ZnTe layer 340 is smaller than that of ZnTe layer 330, which in turn has a smaller thickness than ZnTe layer 320.

The thickness of each individual layer in the second set of discrete layers decreases as the individual layer is located further away from GaN-based layer 350. For example, the thickness of ZnSe layer 335 is larger than that of ZnSe layer 325, which in turn is thicker than ZnSe layer 315.

The variation in thickness described above, has a linear relationship in one exemplary embodiment, and has a non-linear relationship in another exemplary embodiment. In yet another embodiment, the thickness of each individual layer in the first set of discrete layers decreases as the individual layer is located further away from GaN-based layer 350, while thickness of each individual layer in the second set of discrete layers increases as the individual layer is located further away from GaN-based layer 350.

In other embodiments, other compound semiconductors are used instead of ZnSe and ZnTe. Some exemplary embodiments are described below using other figures.

Figure 4:
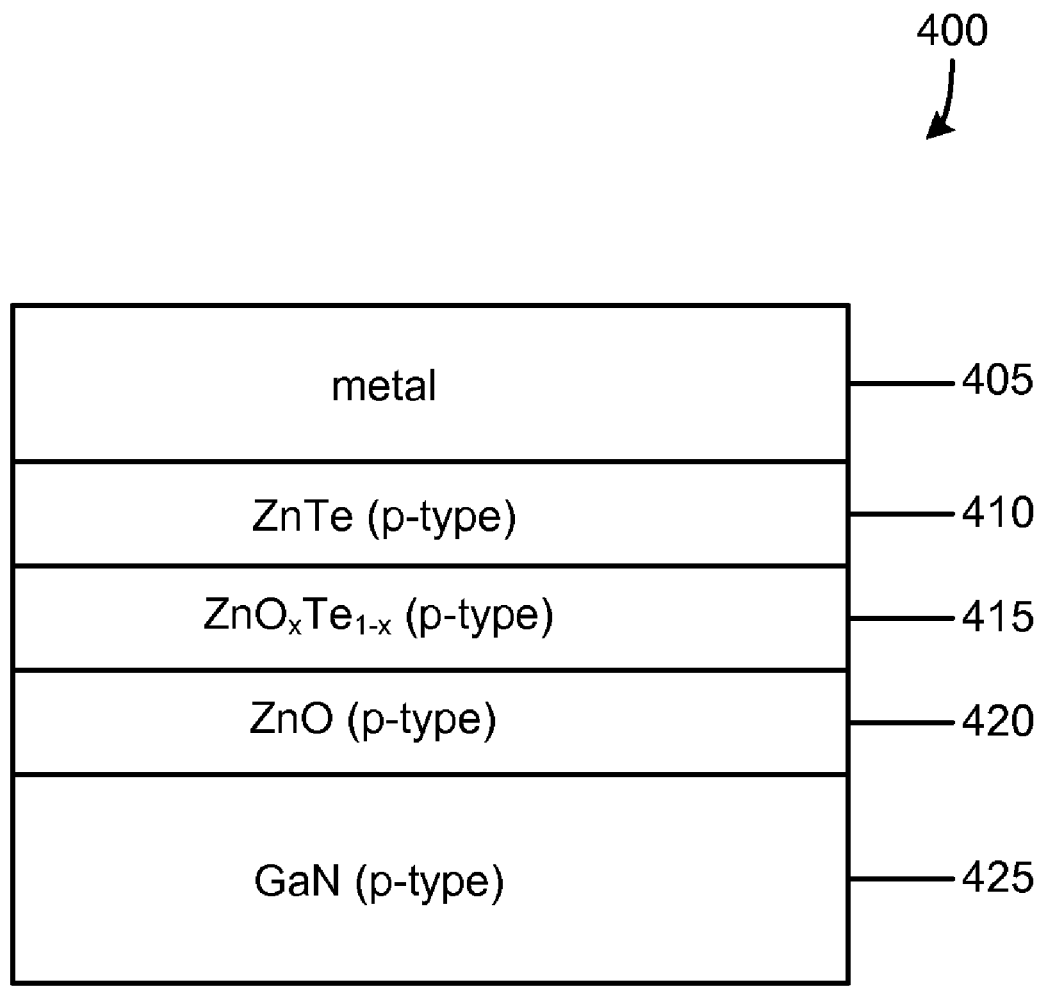
FIG. 4 shows a third exemplary embodiment of an ohmic contact in accordance with the invention.

FIG. 4 shows a third exemplary embodiment of an ohmic contact 400 in accordance with the invention. Ohmic contact 400 provides optimal conductivity between a metal contact, in the form of metal layer 405, and a p-type GaN-based layer 425. Several layers of semiconductor material are sandwiched between p-type GaN-based layer 425 and metal layer 405. The semiconductor materials used in the various layers belong to the Group II-VI family of compound semiconductors, and are generally characterized by the formula XY where X is an element selected from Group II and Y is an element selected from Group VI.

In this exemplary embodiment, the first compound semiconductor is ZnO and the second compound semiconductor is ZnTe. Layer 420 of p-type ZnO is formed on a major surface of GaN-based layer 425. Layer 420 has a small valence band offset with respect to GaN-based layer 425 thereby providing good electrical conductivity between GaN-based layer 425 and layer 420.

Layer 410 of p-type ZnTe is formed on a bottom major surface of metal layer 405. Layer 410 has a small valence band offset with respect to metal thereby providing good electrical conductivity between metal layer 405 and layer 410.

Sandwiched between layer 420 and layer 410 is a graded bandgap region 415 that is generally described using a formula $XY_nZ_{1-n}$ ($0<n<1$) where X is an element from Group II, and Y and Z are two different elements from Group VI. In this exemplary embodiment, p-type $ZnO_xTe_{1-x}$ ($0<x<1$) is used. Graded bandgap region 415 provides a graded transition for bridging the valence gap offset between layer 420 and layer 410. At a location close to layer 420 the p-type $ZnO_xTe_{1-x}$ ($0<x<1$) has a value of x that is nearly equal to 1, while at a location close to layer 410 the p-type $ZnO_xTe_{1-x}$ ($0<x<1$) has a value of x that is nearly equal to 0.

In one embodiment, x varies linearly from 1 to 0 between the two major surfaces of graded bandgap region 415, while in a second embodiment, x varies non-linearly from 1 to 0 between the two major surfaces.

Figure 5:
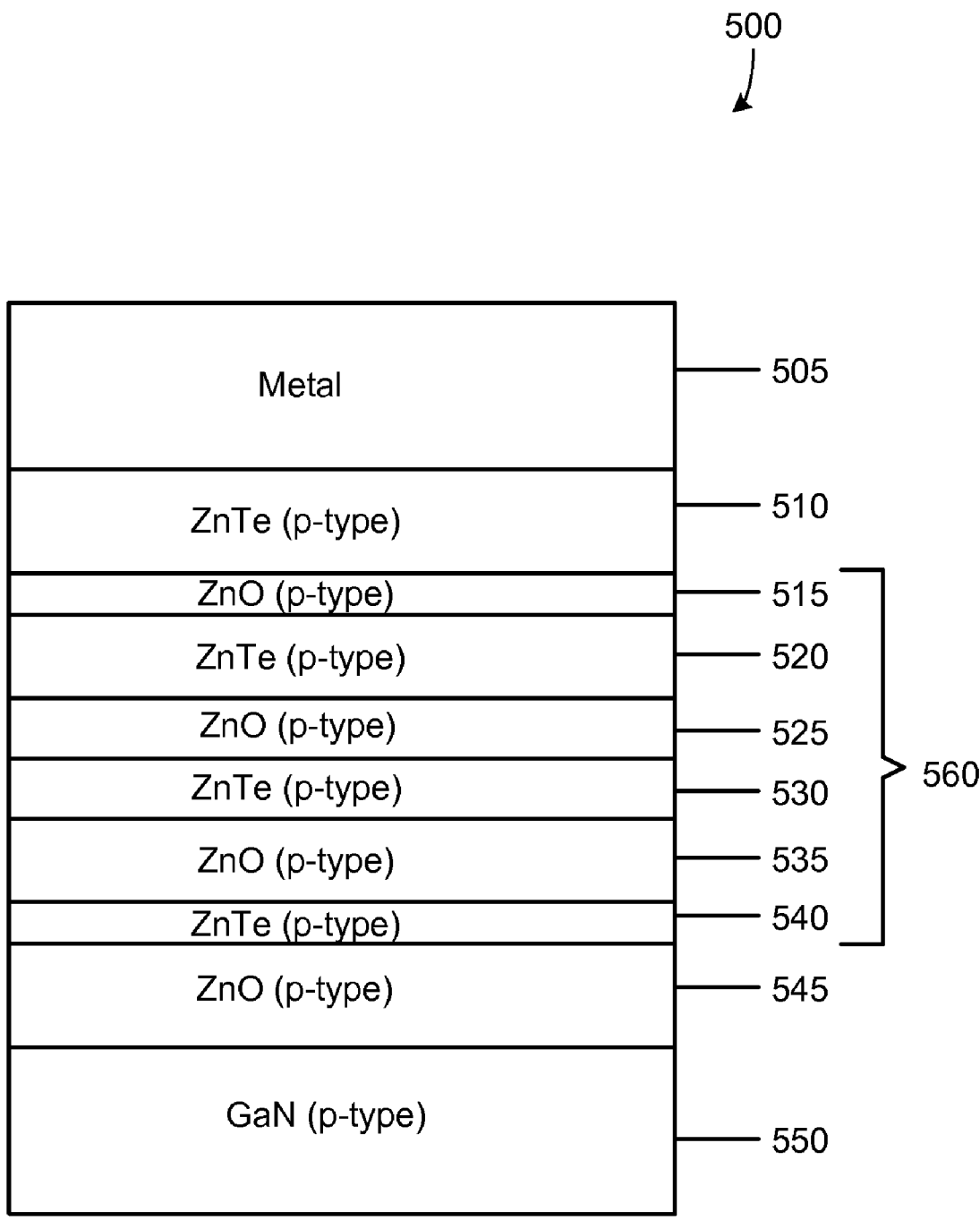
FIG. 5 shows a fourth exemplary embodiment of an ohmic contact in accordance with the invention.

FIG. 5 shows a fourth exemplary embodiment of an ohmic contact 500 in accordance with the invention. Several layers of semiconductor material are sandwiched between p-type GaN-based layer 550 and metal layer 505. Each of these layers contains material that is characterized by the general formula XY where X is an element selected from Group II and Y is an element selected from Group VI. In this fourth exemplary embodiment, the first compound semiconductor is p-type ZnO and the second compound semiconductor is p-type ZnTe.

Layer 545 of p-type ZnO is formed on a major surface of GaN-based layer 550. Layer 510 of p-type ZnTe is formed on a bottom major surface of metal layer 505. Sandwiched between layers 545 and 510 is p-type semiconductor stack 560 having a number of discrete layers. A first set of these discrete layers is formed of p-type ZnTe layers, while a second set of discrete layers of p-type semiconductor stack 560 are formed of p-type ZnO layers. The first set of discrete layers, which includes ZnTe layers 540, 530, and 520, is interspersed with the second set of discrete layers, which includes ZnO layers 535, 525, and 515. For example, ZnTe layer 520 is located between ZnO layers 525 and 515, while ZnO layer 535 is located between ZnTe layers 540 and 530.

The thickness of each individual layer in the first set of discrete layers increases as the individual layer is located further away from GaN-based layer 550. For example, the thickness of ZnTe layer 540 is smaller than that of ZnTe layer 530, which in turn has a smaller thickness than ZnTe layer 520.

The thickness of each individual layer in the second set of discrete layers decreases as the individual layer is located further away from GaN-based layer 550. For example, the thickness of ZnO layer 535 is larger than that of ZnO layer 525, which in turn is thicker than ZnO layer 515.

The variation in thickness described above, has a linear relationship in one exemplary embodiment, and has a non-linear relationship in another exemplary embodiment. In yet another embodiment, the thickness of each individual layer in the first set of discrete layers decreases as the individual layer is located further away from GaN-based layer 550, while thickness of each individual layer in the second set of discrete layers increases as the individual layer is located further away from GaN-based layer 550.

Figure 6:
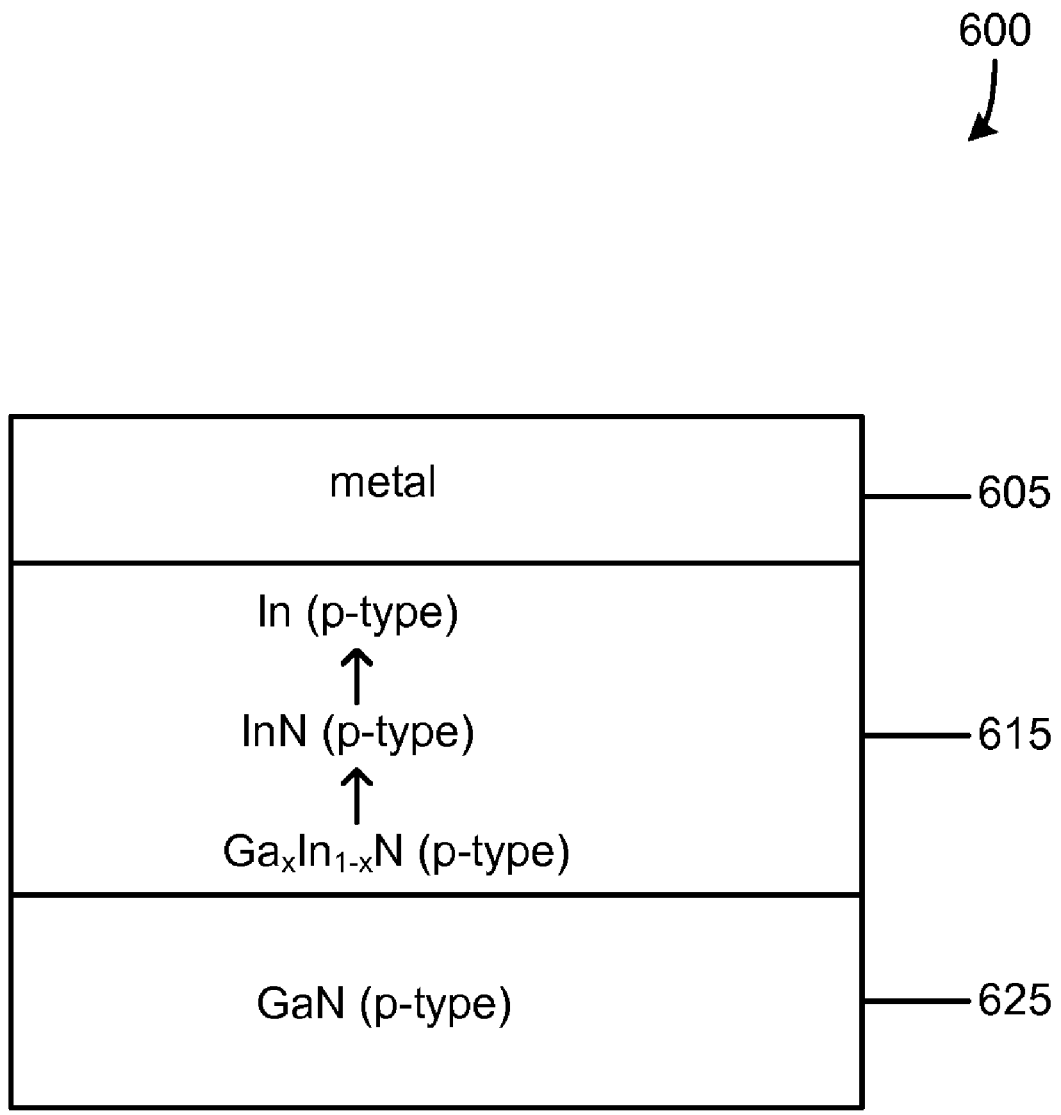
FIG. 6 shows a fifth exemplary embodiment of an ohmic contact in accordance with the invention.

FIG. 6 shows a fifth exemplary embodiment of an ohmic contact 600 in accordance with the invention. Ohmic contact 600 provides optimal conductivity between a metal contact, in the form of metal layer 605, and a p-type GaN-based layer 625. In this exemplary embodiment, the metal of metal layer 605 is a metal other than Indium, for example, gold.

Sandwiched between metal layer 605 and p-type GaN-based layer 625 is a continuously graded bandgap region 615 that is generally described using a formula $Ga_xIn_{1-x}N_y$ ($0 \leq x < 1$) and ($0 \leq y \leq 1$). Graded bandgap region 615 provides a graded transition for bridging the valence gap offset between metal layer 605 and p-type GaN-based layer 625. At a first location close to the p-type GaN-based layer 625, bandgap p-type region 615 contains $Ga_xIn_{1-x}N_y$ with ($0<x<1$) and ($0<y<1$). At a second location in an intermediate portion between p-type GaN-based layer 625 and metal layer 605, bandgap p-type region 615 contains only InN, Ga being eliminated with (x=0) and (y=1). At a third location, close to metal layer 605, the bandgap p-type region 615 contains only one element—Indium, N being eliminated with (x=0) and (y=0). Because Indium is a metal, this portion of bandgap p-type region 615 provides optimal valence band matching with metal layer 605.

In one embodiment, x and y vary linearly between the first major surface of graded bandgap region 615 located adjacent to p-type GaN-based layer 625, and the other major surface located adjacent to metal layer 605.

In another embodiment, x and y vary non-linearly between the first major surface of graded bandgap region 615 located adjacent to p-type GaN-based layer 625, and the other major surface located adjacent to metal layer 605.

Figure 7:
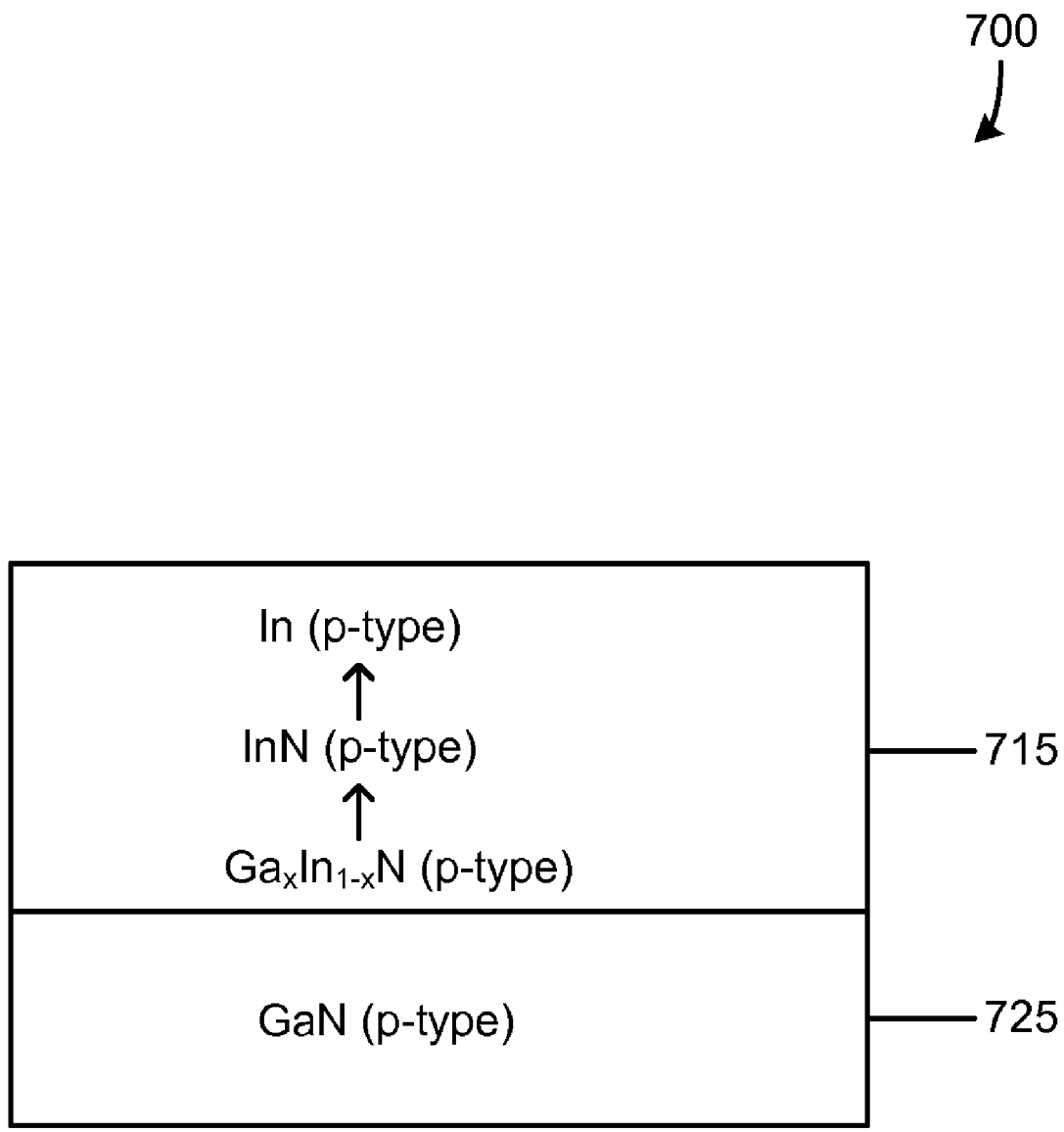
FIG. 7 shows a sixth exemplary embodiment of an ohmic contact in accordance with the invention.

FIG. 7 shows a sixth exemplary embodiment of an ohmic contact 700 in accordance with the invention. Indium is used as the metal of the metal contact of ohmic contact 700. Consequently, in this alternative embodiment, bandgap p-type region 715, which is located adjacent to p-type GaN-based layer 725 extends all the way to the top surface of ohmic contact 700.

The above-described embodiments are merely set forth for a clear understanding of the principles of the disclosure. Many variations and modifications may be made without departing substantially from the disclosure. All such modifications and variations are included herein within the scope of this disclosure.

We claim:

1. An ohmic contact comprising:
   a layer of p-type GaN-based material;
   a layer of metal configured to provide a metal contact;
   a first layer of p-type group II-VI compound semiconductor material comprising a first group VI element, the first layer located adjacent to the layer of p-type GaN-based material; and
   a second layer of p-type group II-VI compound semiconductor material comprising a second group VI element different than the first group VI element, the second layer located adjacent to the layer of metal.

2. The ohmic contact of claim 1, further comprising:
   a graded bandgap region of p-type group II-VI compound semiconductor material sandwiched between the first layer and the second layer, wherein the graded bandgap region of material comprises the first group VI element and the second group VI element.

3. The ohmic contact of claim 2, wherein:
   the p-type GaN-based material is $In_xAl_yGa_{1-x-y}N$;
   the first layer comprises material having a general formula XY wherein X is an element selected from group II and Y is the first group VI element;
   the second layer comprises material having a general formula XZ wherein X is the element selected from group II and Z is the second group VI element; and
   the graded bandgap region of material has a general formula $XY_nZ_{1-n}$ wherein X is an element selected from group II, Y is the first group VI element, and Z is the second group VI element.

4. The ohmic contact of claim 3, wherein the graded bandgap region contains one of a) a linearly graded region of semiconductor material and b) a non-linearly graded region of semiconductor material.

5. The ohmic contact of claim 3, wherein a first valence band offset between the second layer and the layer of metal is less than a second valence band offset between the layer of p-type GaN-based material and the layer of metal.

6. The ohmic contact of claim 5, wherein the first layer comprises a first one of a) ZnTe, b) ZnSe, and c) ZnO; and wherein the second layer comprises a second one of a) ZnTe, b) ZnSe, and c) ZnO, the first one being different than the second one.

* * * * *